US010424531B2

(12) United States Patent
Bitz et al.

(10) Patent No.: US 10,424,531 B2
(45) Date of Patent: Sep. 24, 2019

(54) METHOD FOR MANUFACTURING A SEMICONDUCTOR DEVICE ASSEMBLY WITH THROUGH-MOLD COOLING CHANNEL FORMED IN ENCAPSULANT

(71) Applicant: Micron Technology, Inc., Boise, ID (US)

(72) Inventors: Bradley R. Bitz, Boise, ID (US); Xiao Li, Boise, ID (US); Jaspreet S. Gandhi, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/938,305

(22) Filed: Mar. 28, 2018

(65) Prior Publication Data

US 2018/0219002 A1    Aug. 2, 2018

Related U.S. Application Data

(62) Division of application No. 15/181,212, filed on Jun. 13, 2016, now Pat. No. 9,960,150.

(51) Int. Cl.
*H01L 23/42* (2006.01)
*H01L 25/065* (2006.01)
(Continued)

(52) U.S. Cl.
CPC ............ *H01L 23/42* (2013.01); *H01L 23/427* (2013.01); *H01L 23/4334* (2013.01);
(Continued)

(58) Field of Classification Search
CPC ... H01L 25/0657; H01L 23/427; H01L 23/46; H01L 23/473; H01L 23/42
See application file for complete search history.

(56) References Cited

U.S. PATENT DOCUMENTS 9,524,959 B1    12/2016    Yeh et al.
2010/0117209 A1    5/2010    Bezama et al.
(Continued)

FOREIGN PATENT DOCUMENTS

TW    201606972 A    2/2016

OTHER PUBLICATIONS

Taiwanese Application No. 106119235—Taiwanese Office Action and Search Report, dated Apr. 30, 2018, with English Translation, 25 pages.
(Continued)

*Primary Examiner* — Michael Jung
(74) *Attorney, Agent, or Firm* — Perkins Coie LLP

(57) ABSTRACT

Semiconductor device assemblies having stacked semiconductor dies and thermal transfer devices that include vapor chambers are disclosed herein. In one embodiment, a semiconductor device assembly includes a first semiconductor die having a base region, at least one second semiconductor die at the base region, and a thermal transfer device attached to the first and second dies. The thermal transfer device includes an encapsulant at least partially surrounding the second die and a via formed in the encapsulant. The encapsulant at least partially defines a cooling channel that is adjacent to a peripheral region of the first die. The via includes a working fluid and/or a solid thermal conductor that at least partially fills the channel.

11 Claims, 5 Drawing Sheets

(51) Int. Cl.
  *H01L 23/427* (2006.01)
  *H01L 23/46* (2006.01)
  *H01L 23/473* (2006.01)
  *H01L 23/433* (2006.01)

(52) U.S. Cl.
  CPC ............ *H01L 23/46* (2013.01); *H01L 23/473* (2013.01); *H01L 25/0657* (2013.01); *H01L 2224/16145* (2013.01); *H01L 2224/73204* (2013.01); *H01L 2225/06513* (2013.01); *H01L 2225/06541* (2013.01); *H01L 2225/06568* (2013.01); *H01L 2225/06582* (2013.01); *H01L 2225/06589* (2013.01)

(56) References Cited

U.S. PATENT DOCUMENTS

| | | |
|---|---|---|
| 2011/0147916 A1 | 6/2011 | Su et al. |
| 2011/0304015 A1 | 12/2011 | Kim et al. |
| 2012/0252165 A1* | 10/2012 | Nakanoya ............... H01L 21/56 438/107 |
| 2014/0225248 A1 | 8/2014 | Henderson et al. |
| 2014/0361387 A1 | 12/2014 | Meyer et al. |
| 2014/0367844 A1 | 12/2014 | Hooper et al. |
| 2015/0108661 A1 | 4/2015 | Vincent et al. |
| 2015/0348954 A1 | 12/2015 | Chandolu |
| 2015/0348956 A1 | 12/2015 | Zhang et al. |
| 2016/0056089 A1 | 2/2016 | Taniguchi et al. |
| 2017/0084589 A1 | 3/2017 | Kuo et al. |

OTHER PUBLICATIONS

International Application No. PCT/US2017/036560—International Search Report and Written Opinion, dated Aug. 30, 2017, 9 pages.
Office Action dated Jan. 18, 2019 for Taiwan Patent Application No. 106119235, 7 pages (with translation).

* cited by examiner

METHOD FOR MANUFACTURING A SEMICONDUCTOR DEVICE ASSEMBLY WITH THROUGH-MOLD COOLING CHANNEL FORMED IN ENCAPSULANT

CROSS-REFERENCE TO RELATED APPLICATIONS

This application is a divisional of U.S. application Ser. No. 15/181,212, filed Jun. 13, 2016, which issued as U.S. Pat. No. 9,960,150, which is incorporated herein by reference in its entirety.

TECHNICAL FIELD

The disclosed embodiments relate to semiconductor device assemblies, and in particular to semiconductor device assemblies having a package casing with a through-mold cooling channel.

Packaged semiconductor dies, including memory chips, microprocessor chips, and imager chips, typically include a semiconductor die mounted on a substrate and encased in a plastic protective covering. The die includes functional features, such as memory cells, processor circuits, and imager devices, as well as bond pads electrically connected to the functional features. The bond pads can be electrically connected to terminals outside the protective covering to allow the die to be connected to higher level circuitry.

Semiconductor manufacturers continually reduce the size of die packages to fit within the space constraints of electronic devices, while also increasing the functional capacity of each package to meet operating parameters. One approach for increasing the processing power of a semiconductor package without substantially increasing the surface area covered by the package (i.e., the package's "footprint") is to vertically stack multiple semiconductor dies on top of one another in a single package. The dies in such vertically-stacked packages can be interconnected by electrically coupling the bond pads of the individual dies with the bond pads of adjacent dies using through-silicon vias (TSVs). In vertically stacked packages, the heat generated is difficult to dissipate, which increases the operating temperatures of the individual dies, the junctions therebetween, and the package as a whole. This can cause the stacked dies to reach temperatures above their maximum operating temperatures ($T_{max}$) in many types of devices.

DETAILED DESCRIPTION

Specific details of several embodiments of semiconductor device assemblies having a through-mold cooling channel formed in an encapsulant (e.g., overmold) of a package casing are described below. In various embodiments described below, the through-mold cooling channel includes a thermal conductor that can facilitate heat transfer from one or more semiconductor dies of a semiconductor device assembly. The term "semiconductor device" generally refers to a solid-state device that includes semiconductor material. A semiconductor device can include, for example, a semiconductor substrate, wafer, or die that is singulated from a wafer or substrate. Throughout the disclosure, semiconductor devices are generally described in the context of semiconductor dies; however, semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor device package can also include an interposer substrate that carries one or more semiconductor devices and is attached to or otherwise incorporated into the casing. The term "semiconductor device assembly" can refer to an assembly of one or more semiconductor devices, semiconductor device packages, and/or substrates (e.g., interposer, support, or other suitable substrates). The semiconductor device assembly can be manufactured, for example, in discrete package form, strip or matrix form, and/or wafer panel form. As used herein, the terms "vertical," "lateral," "upper," and "lower" can refer to relative directions or positions of features in the semiconductor device in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

Figure 1A:
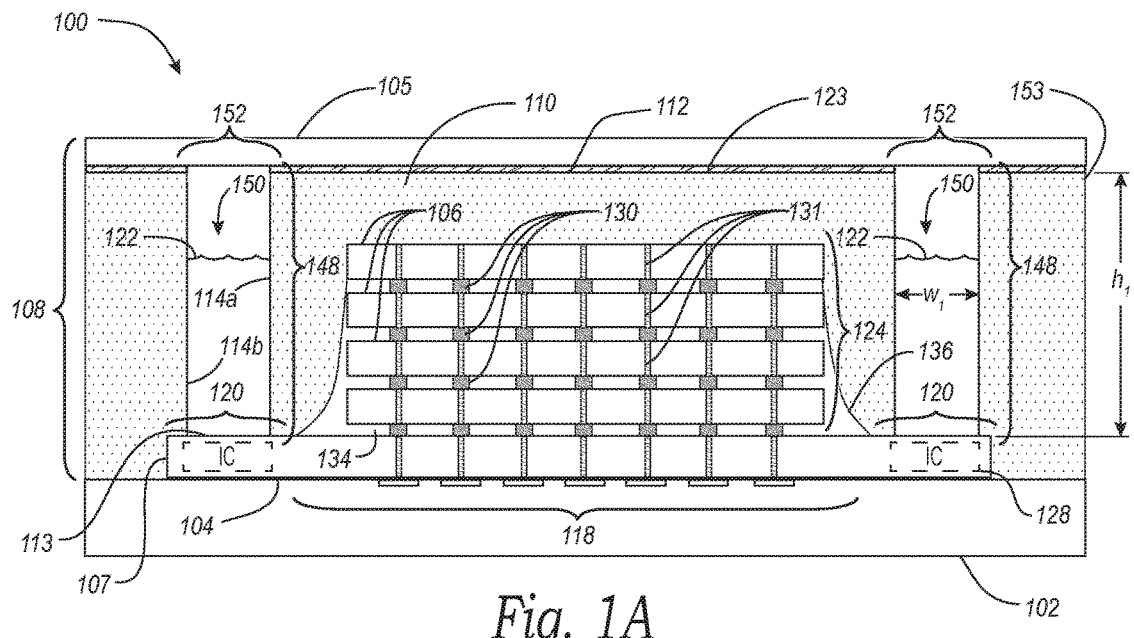
FIGS. 1A and 1B are cross-sectional and top views, respectively, showing a semiconductor device assembly having a cooling channel configured in accordance with an embodiment of the present technology.
Figure 1B:
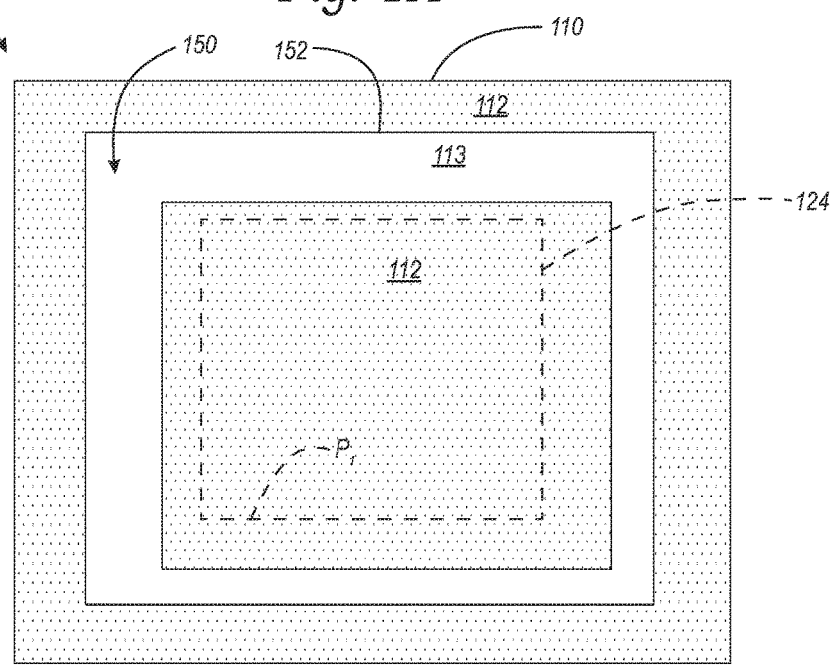

FIG. 1A is a cross-sectional view, and FIG. 1B is top plan view of a semiconductor device assembly 100 ("assembly 100") configured in accordance with an embodiment of the present technology. Referring to FIG. 1A, the assembly 100 includes a package support substrate 102 (e.g., an interposer), a first semiconductor die 104 on the support substrate 102, a plurality of second semiconductor dies 106 mounted to the first die 104, and a thermal transfer device (TTD) 108 over the first and second dies 104 and 106. The first die 104 includes a base region 118 and a peripheral region 120 (known to those skilled in the art as a "porch" or "shelf") adjacent the base region 118. The second dies 106 are arranged in a stack 124 ("die stack 124") on the base region 118.

The TTD 108 includes an encapsulant 110 having an upper surface 112, a via 148 formed in the upper surface 112, and a heat dissipator (e.g., a cover 105) that is coupled to the upper surface 112. The encapsulant 110 forms a protective casing 153 that at least partially surrounds the die stack 124 and an outer portion 107 of the peripheral region 120 of the first die 104. The casing 153 includes inner and outer sidewall portions 114a and 114b (collectively "sidewalls 114"). The sidewalls 114 at least partially define a cavity, or cooling channel 150, such as a hole, a trench, a cavity, or similar feature in the encapsulant 110. The channel 150 has an opening 152 proximate the upper surface 112 of the encapsulant 110. The cavity 150 extends from the upper surface 112 to a lower surface 113 located at the base of the channel. In some embodiments, the lower surface 113 can be an active surface of the first die 104. In one embodiment described below, the active surface can be a surface of a conductive feature, such as a metal trace or contact pad, that is formed on the peripheral region 120 of the first die 104 before forming the encapsulant 110 on the first die 104. In other embodiments described below, the lower surface 113 can be a surface of an interface material (not shown), such as thermal conductor or a dielectric spacer material, that at least partially covers an active surface at the peripheral region 120.

The via 148 includes a thermal conductor at least partially filling the channel 150 and in direct contact with the lower surface 113 at the base of the channel 150. In FIG. 1A, the thermal conductor is a working fluid 122 (e.g., a dielectric fluid) configured to thermally couple the peripheral region 120 of the first die 104 with the cover 105. The cover 105 can be attached to the upper surface 112 of the encapsulant 110 with an adhesive 123. Suitable adhesives can include, for example, a thermal interface material ("TIM") or other adhesives containing, e.g., silicone-based greases, gels, or adhesives that are doped with conductive materials and/or phase change materials. The cover 105 can include a condenser, a heat sink, a heat spreader, and/or other structure for dissipating heat. The working fluid 122 can be a dielectric fluid, such as a dielectric liquid or oil (e.g., a silicon oil), that is generally not electrically conductive. For example, the working fluid 122 can be composed of perfluorocarbons, hydrofluoroethers, fluoroketones, and/or other constituents that increase electrical resistance and prevent the working fluid 122 from interfering with the electrical operation of the assembly 100. In one embodiment the working fluid 122 can be a Novec Engineered Fluid™ available from the 3M Company of Maplewood, Minn. In various embodiments described below, the working fluid 122 and the cover 105 form part of an immersion cooling system configured to transfer heat away from the peripheral region 120 of the first die 104 to the ambient environment outside of the assembly 100.

The encapsulant 110 can include an epoxy resin or other suitable material that can be molded or shaped to form the casing 153 by transfer molding or compression molding. The encapsulant 110 can include various additives (e.g., coupling agents, cure promoters, silica fillers, such as alumina fillers, etc.) selected to have suitable thermal conductivity, adhesion, chemical resistance, strength, and/or other properties. The channel 150 can be formed by etching, laser cutting, sawing, or otherwise removing portions of the encapsulant 110 adjacent the die stack 124 and the peripheral region 120 of the first die 104. In some embodiments, the channel 150 can have a width $w_1$ in the range of about 200 to about 1,000 μm (e.g., 500 μm), and a height $h_1$ in the range of about 500 to about 1,500 μm (e.g., 700 μm or 1100 μm).

The first and second dies 104 and 106 can include various types of semiconductor components and functional features, such as dynamic random-access memory (DRAM), static random-access memory (SRAM), flash memory, other forms of integrated circuit memory, processing circuits, imaging components, and/or other semiconductor features. In various embodiments, for example, the assembly 100 can be configured as a hybrid memory cube (HMC) in which the stacked second dies 106 are DRAM dies or other memory dies that provide data storage and the first die 104 is a high-speed logic die that provides memory control (e.g., DRAM control) within the HMC. In other embodiments, the first and second dies 104 and 106 may include other semiconductor components and/or the semiconductor components of the individual second dies 106 in the die stack 124 may differ. In the embodiment illustrated in FIG. 1A, the first die 104 includes an integrated circuit 128 formed in the peripheral region 120. In one embodiment, the portion of the integrated circuit 128 in the peripheral region 120 can include one or more circuit components that produce relatively large amounts of heat during operation, such as serial/deserializer (SERDES) circuits. In a related embodiment, circuit components that produce relatively smaller amounts of heat during operation can be located away from the peripheral region and/or directly beneath the die stack 124.

The die stack 124 can be electrically coupled to the package support substrate 102 and to one another by a plurality of electrically conductive elements 130 (e.g., copper pillars, solder bumps, and/or other conductive features). Each of the first and second dies 104 and 106 can include a plurality of through-silicon vias (TSVs) 131 that are coupled on opposite sides to the conductive elements 130. In addition to electrical communication, the conductive elements 130 and the TSVs 131 transfer heat at least vertically away from the die stack 124 and toward the cover 105. In some embodiments, the assembly 100 can also include a plurality of thermally conductive elements or "dummy elements" (not shown) positioned interstitially between the first and second dies 104 and 106 to further facilitate heat transfer through the die stack 124. Such dummy elements can be at least generally similar in structure and composition to the conductive elements 130 and/or the TSVs 131 except that they are not electrically coupled to the functional circuitry of the first and second dies 104 and 106.

The assembly 100 can further include an underfill material 134 between each of the second dies 106 and between the first die 104 and the bottom second die 106 to provide mechanical support and electrical isolation between the conductive elements 130. The underfill material 134 can form a fillet 136 that extends outwardly from the die stack 124 in a region proximate the first die 104. In some embodiments, the encapsulant 110 can conform to the shape of the fillet 136. In other embodiments, the fillet 136 can be partially etched or removed to increase the relative width $w_1$ of the via 148.

Figure 2:
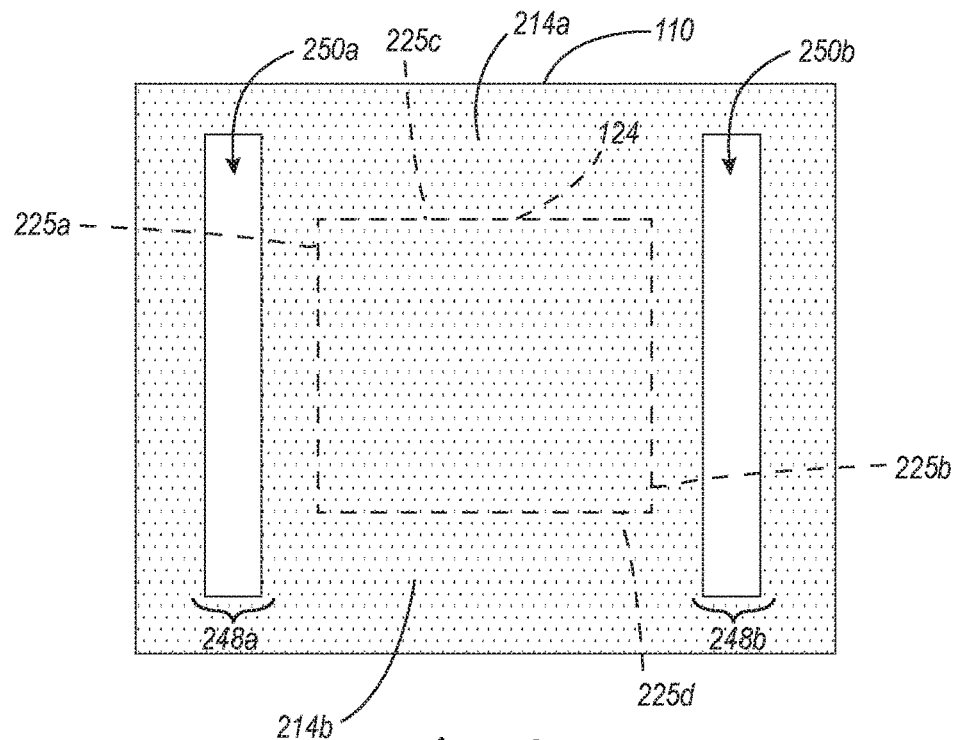
FIGS. 2 and 3 are top views showing semiconductor device assemblies having through-mold and other cooling features configured in accordance with embodiments of the present technology.

FIG. 1B shows the channel 150 in more detail with the cover 105 (FIG. 1A) removed from the assembly 100 for purposes of illustration. The working fluid 122 (FIG. 1A) can be instilled into the channel 150 and over the lower surface 113 via the opening 152 in the encapsulant 110. In FIG. 1B, the channel 150 surrounds an outer perimeter $P_1$ of the die stack 124 (shown in hidden lines). In other embodiments, the channel 150 does not completely surround the die stack 124. For example, in one embodiment shown in FIG. 2, a channel of a via 248a can be an elongated trench 250a that is formed in the encapsulant 110 and extends over fewer than all of the sides (e.g., a left-hand side 225a) of the die stack 124. In some embodiments, another via 248b can be formed in the encapsulant 110 over one or more other sides (e.g., a right-hand side 225b) of the die stack 124. The via 248b can be formed in a trench 250b that is similar to the trench 250a (collectively "trenches 250"). In the example of FIG. 2, the trenches 250 are spaced laterally apart from one another, and both are filled with the working fluid 122 (FIG. 1A). The encapsulant 110 can include outer sidewall portions 214a and 214b (collectively "sidewalls 214") that extend between the trenches 250 and along opposite sides 225c and 225d of the die stack 124.

Figure 3:
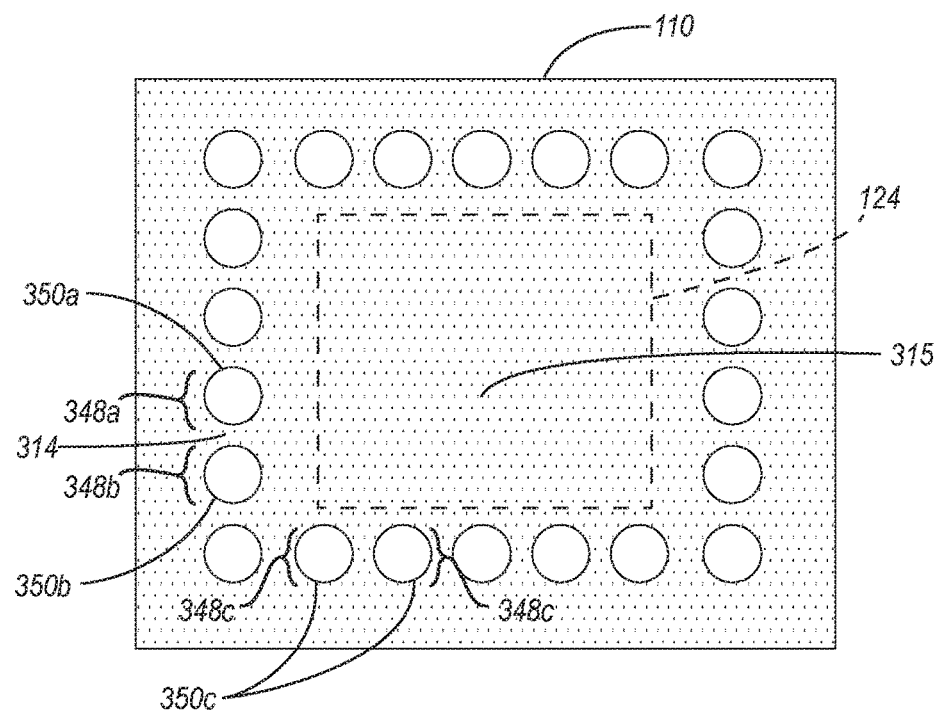

In another embodiment shown in FIG. 3, a cavity of a via 348a can be a hole 350a (e.g., a circular-, square-, or rectangular-shaped hole) that is formed in the encapsulant 110. The hole 350a can be positioned proximate to another hole 350b of an adjacent via 348b. In FIG. 3, other vias 348c and corresponding holes 350c are formed in the encapsulant 110 and arrayed along the various sides of the die stack 124. The encapsulant 110 includes individual separator portions 314 ("separators 314") between the individual holes 350a-c and separating the individual vias 348a-348c from one another. The holes 350a-c can each be filled with the working fluid 122 (FIG. 1A). In one embodiment described below, holes, trenches, channels, and/or other cavities can be formed in an upper region 315 of the encapsulant located above the die stack 124.

In various embodiments, the shape, size (e.g., the width), position, and/or the number of the channels in the encapsulant can be selected to increase attachment strength of the encapsulant 110. Referring back to FIG. 1A, in some embodiments a smaller channel 150 and/or a fewer number of smaller channels distributed along the perimeter $P_1$ (FIG. 1B) of the die stack 124 can increase the amount of surface-to-surface contact between the encapsulant 110 and the various components of the assembly 100, such as the cover 105, the support substrate 102, the first die 104, one or more of the second dies 106, and/or the fillet 136. In addition or alternatively, one or more of the sidewalls 114, the sidewalls 214 (FIG. 2), the separators 314 (FIG. 3), and/or other features formed in the encapsulant 110 can be sized and/or positioned to provide suitable structural reinforcement. In some embodiments, increased surface-to-surface contact and/or structural reinforcement can prevent the encapsulant from collapsing, folding, and/or de-laminating during manufacture, such as when the cover 105 is installed on the encapsulant 110 and/or when the working fluid 122 is instilled in a channel or other fluid-containing feature(s) of a via.

Figure 4:
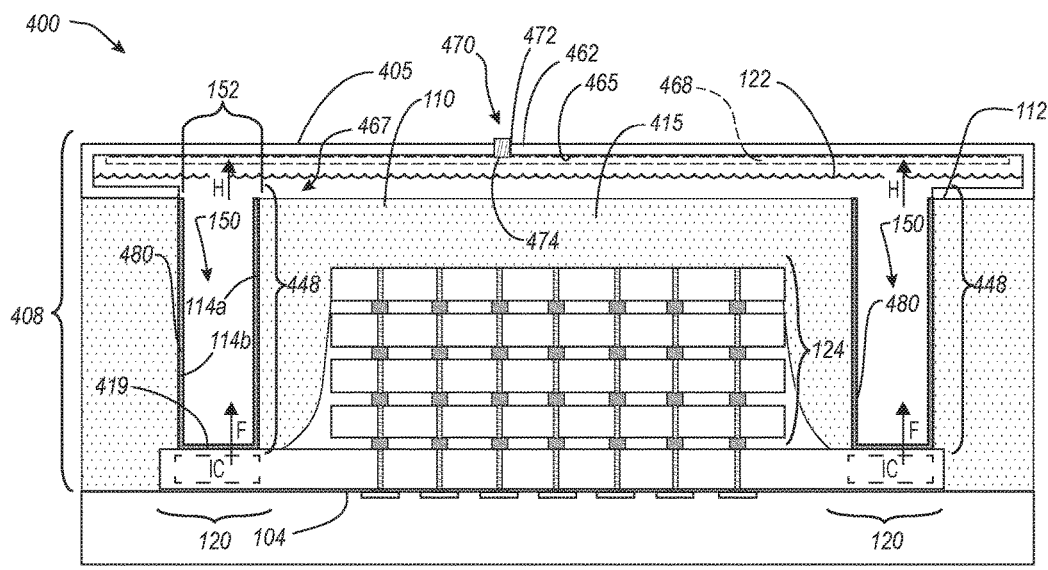
FIGS. 4-7 are cross-sectional views showing semiconductor device assemblies having through-mold and other cooling features configured in accordance with embodiments of the present technology.

FIG. 4 is a cross-sectional view of a semiconductor device assembly 400 ("assembly 400") configured in accordance with another embodiment of the present technology. The assembly 400 can include features generally similar to the semiconductor devices assemblies described above with reference to FIGS. 1A-3. For example, the assembly 400 includes a TTD 408 having a via 448 formed in the encapsulant 110. In FIG. 4, however, the TTD 408 includes a condenser structure 405 ("condenser 405") coupled to the upper surface 112 of the encapsulant 110.

The condenser 405 can be attached to the upper surface 112 using, e.g., an adhesive (not shown), such as a TIM. The condenser 405 includes an outer wall 462 having an interior surface 465, and a condensation region 468 located at the interior surface 465. The outer wall 462 defines a cavity, or internal compartment 467, that is fluidly coupled to the channel 150 in the encapsulant 110 via the opening 152. In some embodiments, the outer wall 462 can be formed from thermally conductive materials, such as copper, aluminum, ceramic materials, or other materials having suitably high thermal conductivities. In one embodiment, the outer wall 462 is formed from extruded metal that is crimped or bent to define the shape of the compartment 467. In another embodiment, the compartment 467 is formed from conductive metal members joined together by brazing or other metal joining processes.

In some embodiments, the condenser 405 can include other structures and/or features attached to or integrally formed in the outer wall 462. For example, the condenser 405 can include an additional heat sink (not shown), such as conductive fins, or the outer wall 462 can be made from a semiconductor material (e.g., silicon). In some embodiments, the outer wall 462 can include an inlet 470 having an opening 472 through which the working fluid 122 is dispensed into the compartment 467 and the channel 150 in the encapsulant 110. The fluid inlet 470 can be capped with a plug 474 (e.g., a metal or plastic plug) that seals (e.g., hermetically seals) the interior cavity of the TTD 408. In some embodiments, the plug 474 may be removable from the opening 472 so that the working fluid 122 can be replenished through the inlet 470. In other embodiments, the outer wall 462 can be permanently sealed.

The condensation region 468 extends over a portion of the interior surface 465 above the channel 150 and the upper surface 112 of the encapsulant 110. In some embodiments, the condensation region 468 can include a wicking feature (e.g., a mesh) configured to wick condensed (i.e., liquid phase) fluid along the interior surface 465 to return the fluid to the reservoir of fluid located below the condensation region 468. In FIG. 4, the working fluid 122 completely fills the channel 150, and at least partially fills the compartment 467. In other embodiments, the working fluid 122 can completely fill the compartment 467. Alternately, the compartment 467 can be generally empty and the channel 150 can be partially or completely filled with the working fluid 122.

The via 448 further includes an interface material, or thermally conductive liner 480, over a surface 419 of the peripheral region 120 of the first die 104 and over the sidewalls 114 in the channel 150. In some embodiments, the conductive liner 480 can include an electroless or electroplated copper (e.g., porous copper), a solder paste, and/or a sintered silver paste. The material of the conductive liner can be selected to have a high thermal conductivity to facilitate heat transfer. For example, copper, solder paste, and sintered silver paste can have thermal conductivities of 300 W/mk, 58 W/mk, and 175 W/mk, respectively. In additional or alternate embodiments, the conductive liner 480 can include an isotropic/anisotropic adhesive, a ceramic material, or a TIM. In some embodiments the conductive liner 480 can be coated with an ultrathin moisture barrier and/or dielectric barrier, such as a CVD-deposited parylene.

In operation, as the assembly 400 is heated to and/or operating at an elevated temperature, the first die 104 transfers heat from the peripheral region 120 into the working fluid 122 proximate the channel 150, as shown by arrows F. In some embodiments, heat produced by the die stack 124 can also be transferred into the working fluid 122 through an upper region 415 of the encapsulant 110 that overlies the stack 124. When the working fluid 122 is heated above its vaporization temperature, the fluid vaporizes, as shown by arrows H. The vapor-phase fluid diffuses into the condensation region 468, where it condenses due to the relatively lower temperature in this region. As the working fluid 122 condenses, its latent heat is transferred to the outer wall 462 of the condenser 405, which in turn transfers the latent heat to the external environment outside of the assembly 400. Evaporative cooling can continue as the condensed working fluid 122 is re-heated and vaporized in the channel 150 and the compartment 467 and, again, condensed in the condensation region 468.

Figure 5:
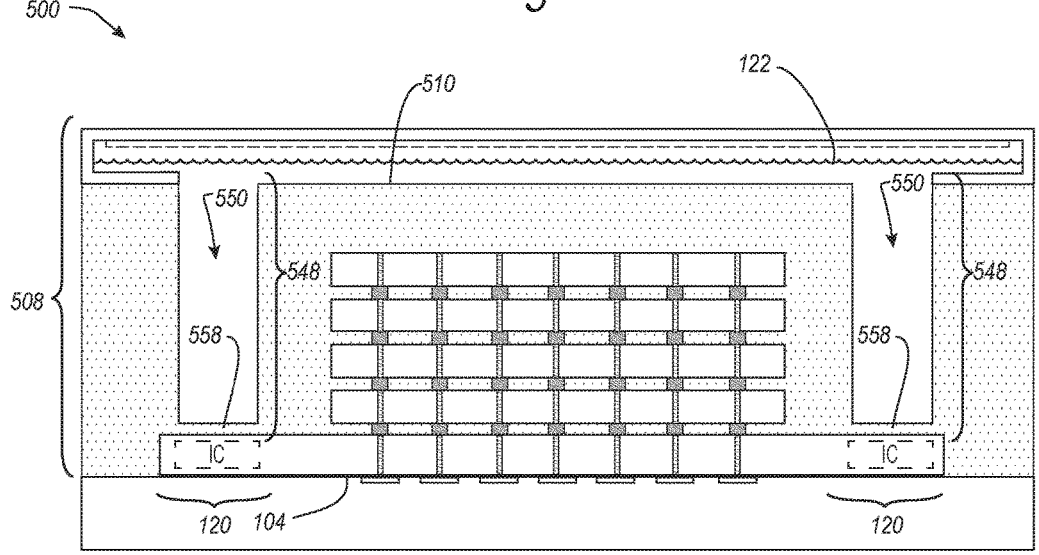

FIG. 5 is a cross-sectional view of a semiconductor device assembly 500 ("assembly 500") configured in accordance with another embodiment of the present technology. The assembly 500 can include features generally similar to the semiconductor devices assemblies described above with reference to FIGS. 1A-4. For example, the assembly 500 includes a TTD 508 having an encapsulant 510 and a via 548 with a channel 550 formed in an encaspulant 510 and filled with the working fluid 122. In FIG. 5, however, the via 548 includes a spacer material 558 (e.g., a dielectric material) that covers the peripheral region 120 of the first die 104 at the base of the channel 550. The spacer material 558 can comprise a portion of the encapsulant 510. In some embodiments, the spacer material 558 can be a portion of the encapsulant 510 that is left over after forming the channel 550 in the encapsulant 510. In various embodiments, the channel 550 is partially or entirely shaped or molded during an encapsulation process, such as film assist molding, cavity direct injection molding, etc. In other embodiments, the channel 550 can be formed after encapsulation, such as with mechanical, chemical, and/or laser approaches through dicing, etching, ablation, and/or other material removal processes. In various embodiments, the channel can be formed in the encapsulant when it is in discrete package form, in strip or matrix form, or in wafer panel form.

The spacer material 558 can be configured to provide a thermally conductive path between the working fluid 122 and the peripheral region 120 of the first die 104, while also electrically insulating the peripheral region 120. The spacer material 558 can have a thickness and/or composition configured to electrically insulate an active surface at the peripheral region 120. In some embodiments, the spacer material 558 can provide electrical insulation in cases where the working fluid 122 is more electrically conductive than a traditional dielectric fluid. In such embodiments the working fluid 122 may include ethylene glycol or other constituents that tend to increase electrical conductivity.

Figure 6:
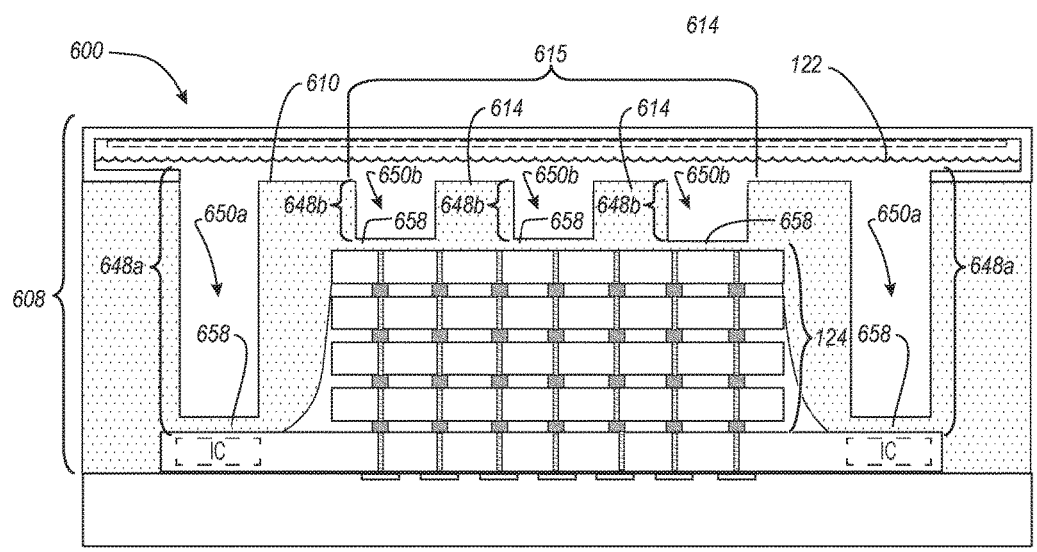

FIG. 6 is a cross-sectional view of a semiconductor device assembly 600 ("assembly 600") configured in accordance with another embodiment of the present technology. The assembly 600 can include features generally similar to the semiconductor devices assemblies described above with reference to FIGS. 1A-5. For example, the assembly 600 includes a TTD 608 having a first via 648a with a first channel 650a formed in an encapsulant 610 and filled with the working fluid 122. In FIG. 6, however, the TTD 608 includes a plurality of second vias 648b formed in an upper region 615 of the encapsulant 610 above the die stack 124. Each of the second vias 648b extends into a corresponding second channel 650b in the upper region 615 and positioned between opposing sidewall portions 614. The second channels 650b are filled with the working fluid 122. Each of the vias 648a and 648b includes a spacer material 658 at the base of the corresponding channels 650a and 650b. In other embodiments, the spacer material 658 may be omitted from the first via 648a and/or the second vias 648b. Alternately, the individual vias 648a and 648b can include a metal liner in addition to or in lieu of the spacer material 658.

Figure 7:
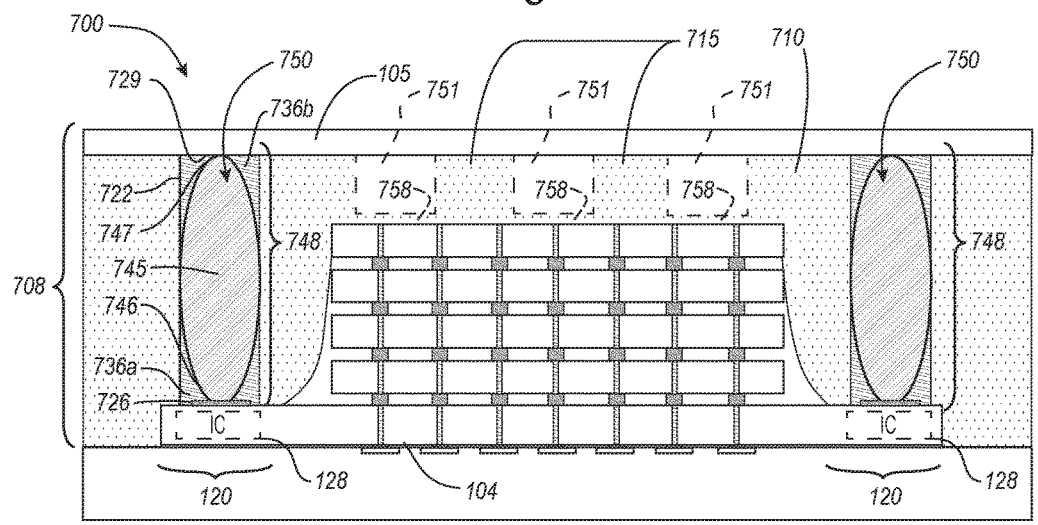

FIG. 7 is a cross-sectional view of a semiconductor device assembly 700 ("assembly 700") configured in accordance with another embodiment of the present technology. The assembly 700 can include features generally similar to the semiconductor devices assemblies described above with reference to FIGS. 1A-6. For example, the assembly 700 includes a TTD 708 having a via 748 with that includes a channel 750 formed in an encapsulant 710. In FIG. 7, however, the channel 750 is filled with a thermal conductor comprising a solid fill material 722 in lieu of the working fluid 122 (FIG. 1). The solid fill material 722 can include a metal core 745, such as a copper core solder ball, that extends between the cover 105 and the peripheral region 120 of the first die 104. The metal core 745 has a lower portion 746 that is coupled to the peripheral region 120 by a first conductive material 736a, and an upper portion 747 that is coupled to an inner surface 729 of the cover 105 by a second conductive material 736b. The first and second conductive materials can include, for example, metal solder, a conductive paste, a TIM, or the like. In FIG. 7, the peripheral region 120 of the first die 104 includes a contact pad 726 (e.g., a metal pad) that provides a surface for to which the first conductive material 736a is attached (e.g., soldered). In some embodiments, the contact pad 726 can be a dummy pad that is not electrically connected to the integrated circuit 128 or other electrical features of the first die 104.

In other embodiments, the assembly 700 can include one or more additional vias 751 (shown in hidden lines) formed in an upper region 715 of the encapsulant 710 and filled with a solid fill material (not shown) in a manner similar to the via 750. The additional vias 751 can extend completely through the upper region 715 to contact the uppermost second die 106 of the die stack 124, or partially through the upper region 715 to leave a spacer material between the via 751 and the uppermost second die 106, as discussed above.

Figure 8:
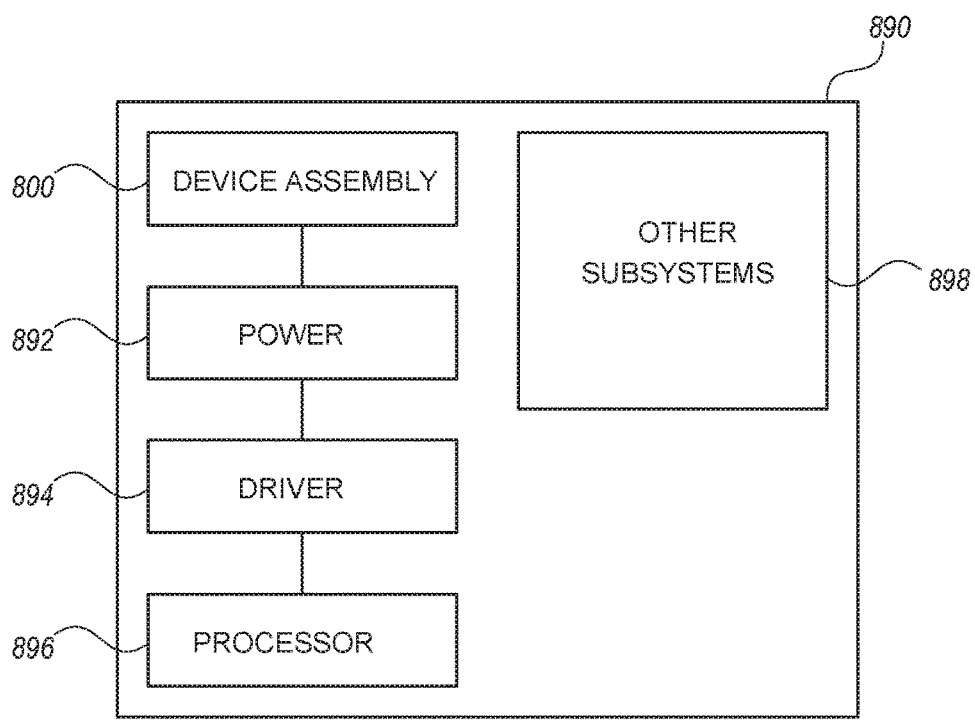
FIG. 8 is a schematic view showing a system that includes a semiconductor device in accordance with embodiments of the present technology.

Any one of the stacked semiconductor device assemblies described above with reference to FIGS. 1A-7 can be incorporated into any of a myriad of larger and/or more complex systems, a representative example of which is system 890 shown schematically in FIG. 8. The system 890 can include a semiconductor device assembly 800, a power source 892, a driver 894, a processor 896, and/or other subsystems or components 898. The semiconductor device assembly 800 can include features generally similar to those of the semiconductor device assemblies described above with reference to FIGS. 1A-7, and can therefore include various features that enhance heat dissipation. The resulting system 890 can perform any of a wide variety of functions, such as memory storage, data processing, and/or other suitable functions. Accordingly, representative systems 890 can include, without limitation, hand-held devices (e.g., mobile phones, tablets, digital readers, and digital audio players), computers, vehicles, appliances and other products. Components of the system 890 may be housed in a single unit or distributed over multiple, interconnected units (e.g., through a communications network). The components of the system 890 can also include remote devices and any of a wide variety of computer readable media.

From the foregoing, it will be appreciated that specific embodiments of the technology have been described herein for purposes of illustration, but that various modifications may be made without deviating from the disclosure. Further, although many of the embodiments of the semiconductor die assemblies are described with respect to HMCs, in other embodiments the semiconductor die assemblies can be configured as other memory devices or other types of stacked die assemblies. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A method for manufacturing a semiconductor device assembly, comprising:

at least partially encapsulating a stack of semiconductor dies in an encapsulant that includes an upper surface, wherein the stack of semiconductor dies includes a plurality of semiconductor dies having a first die and a stack of second dies on the first die; and forming a via in the encapsulant, wherein forming the via includes— forming a cavity in the encapsulant, wherein the cavity extends past at least a portion of the stack of second dies from the upper surface of the encapsulant toward the first die and is disposed above a peripheral region of the first die, and depositing a thermal conductor at least in the cavity, wherein the thermal conductor includes a solid fill material.

2. The method of claim 1 wherein the solid fill material includes a metal core.

3. The method of claim 1 wherein:

forming the via further includes depositing an interface material over the peripheral region of the first die through the cavity; and depositing the thermal conductor includes depositing the solid fill material in the cavity after depositing the interface material.

4. The method of claim 1, further comprising forming a dielectric spacer at a base of the cavity, wherein the dielectric spacer is between the thermal conductor and the peripheral region of the first die.

5. The method of claim 4 wherein the dielectric spacer comprises a portion of the encapsulant.

6. The method of claim 1, further comprising positioning a heat dissipator over an opening of the cavity and attaching the heat dissipator to the encapsulant.

7. The method of claim 1 wherein forming the via in the encapsulant further includes soldering the solid fill material to a surface of the peripheral region within the cavity.

8. The method of claim 1 wherein the forming the cavity include forming a channel in a package casing, wherein the package casing at least partially surrounds the stack of semiconductor dies.

9. The method of claim 1, further comprising:

forming the encapsulant over a semiconductor wafer; and forming a plurality of channels in the encapsulant, wherein one of the channels include the cavity.

10. The method of claim 1, further comprising:

forming the encapsulant over a plurality of stacks of semiconductor dies arranged in an array; and forming a plurality of channels in the encapsulant, wherein one of the channels include the cavity.

11. A method for manufacturing a semiconductor device assembly, comprising:

at least partially encapsulating a first semiconductor die and a second semiconductor die in an encapsulant;

forming a cavity in the encapsulant, the cavity disposed above a peripheral region of the first semiconductor die; and at least partially filling the cavity with a working fluid such that the working fluid directly contacts a thermally conductive feature at the peripheral region of the first semiconductor die, wherein the thermally conductive feature at the peripheral region of the first semiconductor die includes a thermally conductive liner between the peripheral region of the first semiconductor die and the working fluid.

* * * * *